(12) United States Patent
Osborne et al.

(10) Patent No.: US 8,075,692 B2
(45) Date of Patent: Dec. 13, 2011

(54) FLUID BED REACTOR

(75) Inventors: E. Wayne Osborne, Moses Lake, WA (US); Michael V. Spangler, Soap Lake, WA (US); Levi C. Allen, Warden, WA (US); Robert J. Geertsen, Moses Lake, WA (US); Paul E. Ege, Markham (CA); Walter J. Stupin, Whittier, CA (US); Gerald Zeininger, Long Beach, CA (US)

(73) Assignee: Rec Silicon Inc, Moses Lake, WA (US)

( * ) Notice: Subject to any disclaimer, the term of this patent is extended or adjusted under 35 U.S.C. 154(b) by 0 days.

(21) Appl. No.: 12/948,557

(22) Filed: Nov. 17, 2010

(65) Prior Publication Data

US 2011/0117729 A1    May 19, 2011

Related U.S. Application Data

(60) Provisional application No. 61/262,401, filed on Nov. 18, 2009.

(51) Int. Cl.
*C23C 16/455* (2006.01)
*C23C 16/442* (2006.01)
*C23F 1/00* (2006.01)
*H01L 21/306* (2006.01)
*C23C 16/22* (2006.01)
*C23C 16/06* (2006.01)

(52) U.S. Cl. ............. 118/715; 118/DIG. 5; 156/345.33; 156/345.37

(58) Field of Classification Search .............. 118/715, 118/DIG. 5; 156/345.33, 345.37
See application file for complete search history.

(56) References Cited

U.S. PATENT DOCUMENTS

| | | | | |
|---|---|---|---|---|
| 3,306,768 | A * | 2/1967 | Peterson | 427/255.34 |
| 3,640,689 | A * | 2/1972 | Glaski et al. | 428/627 |
| 3,974,003 | A * | 8/1976 | Zirinsky et al. | 438/287 |
| 4,207,360 | A * | 6/1980 | Padovani | 427/213 |
| 4,533,410 | A * | 8/1985 | Ogura et al. | 117/99 |
| 4,732,110 | A * | 3/1988 | Parsons | 118/719 |
| 4,747,367 | A * | 5/1988 | Posa | 118/715 |
| 4,761,269 | A * | 8/1988 | Conger et al. | 118/679 |
| 4,911,102 | A * | 3/1990 | Manabe et al. | 118/719 |
| 5,022,343 | A * | 6/1991 | Fujikawa et al. | 118/47 |

(Continued)

FOREIGN PATENT DOCUMENTS

CN    11318654    12/2008

(Continued)

OTHER PUBLICATIONS

Maxi-Zone® MZ High Temperature Insertion Heaters brochure, undated, 2 pp.

(Continued)

*Primary Examiner* — Rudy Zervigon
(74) *Attorney, Agent, or Firm* — Klarquist Sparkman, LLP

(57) ABSTRACT

Fluidized bed reactor systems for producing high purity silicon-coated particles are disclosed. A vessel has an outer wall, an insulation layer inwardly of the outer wall, at least one heater positioned inwardly of the insulation layer, a removable concentric liner inwardly of the heater, a central inlet nozzle, a plurality of fluidization nozzles, at least one cooling gas nozzle, and at least one product outlet. The system may include a removable concentric sleeve inwardly of the liner. In particular systems the central inlet nozzle is configured to produce a primary gas vertical plume centrally in the reactor chamber to minimize silicon deposition on reactor surfaces.

28 Claims, 10 Drawing Sheets

U.S. PATENT DOCUMENTS

| | | | | |
|---|---|---|---|---|
| 5,062,386 | A | * | 11/1991 | Christensen .................. 118/725 |
| 5,139,762 | A | | 8/1992 | Flagella |
| 5,284,519 | A | * | 2/1994 | Gadgil .......................... 118/719 |
| 5,370,738 | A | * | 12/1994 | Watanabe et al. ............. 118/725 |
| 5,374,413 | A | * | 12/1994 | Kim et al. ..................... 423/349 |
| 5,382,412 | A | * | 1/1995 | Kim et al. ..................... 422/142 |
| 5,704,985 | A | * | 1/1998 | Kordina et al. ............... 118/725 |
| 5,798,137 | A | | 8/1998 | Lord et al. |
| 5,810,934 | A | * | 9/1998 | Lord et al. .................... 118/725 |
| 5,879,462 | A | * | 3/1999 | Kordina et al. ............... 118/725 |
| 5,888,303 | A | * | 3/1999 | Dixon ........................... 118/715 |
| 5,975,011 | A | * | 11/1999 | Ohkusa et al. ................ 118/715 |
| 5,993,542 | A | * | 11/1999 | Yanashima et al. ............. 117/84 |
| 6,004,396 | A | * | 12/1999 | Ishikawa ....................... 118/715 |
| 6,039,812 | A | * | 3/2000 | Ellison et al. ................. 118/725 |
| 6,045,617 | A | * | 4/2000 | Keller ........................... 118/707 |
| 6,190,459 | B1 | * | 2/2001 | Takeshita et al. ............. 118/715 |
| 6,191,388 | B1 | * | 2/2001 | Cleaver et al. ................ 219/390 |
| 6,299,683 | B1 | * | 10/2001 | Rupp et al. ...................... 117/88 |
| 6,541,377 | B2 | | 1/2003 | Kim et al. |
| 6,827,786 | B2 | * | 12/2004 | Lord ............................. 118/716 |
| 7,029,632 | B1 | | 4/2006 | Weidhaus et al. |
| 7,052,546 | B1 | * | 5/2006 | Motakef et al. ................. 117/84 |
| 7,118,781 | B1 | * | 10/2006 | Sumakeris et al. ......... 427/248.1 |
| 7,361,222 | B2 | * | 4/2008 | Janzen et al. ................. 117/103 |
| 7,377,977 | B2 | * | 5/2008 | Motakef et al. ................. 117/86 |
| 7,553,466 | B2 | | 6/2009 | Herold et al. |
| 7,632,478 | B2 | | 12/2009 | Poepken et al. |
| 7,658,900 | B2 | | 2/2010 | Berthold et al. |
| 7,771,687 | B2 | * | 8/2010 | Kim et al. ..................... 423/348 |
| 2002/0081250 | A1 | | 6/2002 | Lord |
| 2003/0106495 | A1 | * | 6/2003 | Asano et al. .................. 118/724 |
| 2003/0118728 | A1 | * | 6/2003 | Sion et al. ................... 427/249.2 |
| 2004/0168769 | A1 | * | 9/2004 | Matsuoka et al. ....... 156/345.33 |
| 2006/0088970 | A1 | | 4/2006 | Hesse et al. |
| 2008/0056979 | A1 | | 3/2008 | Arvidson et al. |
| 2008/0220166 | A1 | * | 9/2008 | Ege et al. ................ 427/255.395 |
| 2008/0267834 | A1 | * | 10/2008 | Kim et al. ..................... 422/139 |
| 2008/0299015 | A1 | | 12/2008 | Lord |
| 2008/0299291 | A1 | * | 12/2008 | Weidhaus et al. .................. 427/8 |
| 2009/0047204 | A1 | | 2/2009 | Kim et al. |
| 2009/0095710 | A1 | | 4/2009 | Kim et al. |
| 2010/0068116 | A1 | * | 3/2010 | Kim et al. ..................... 423/349 |
| 2011/0117729 | A1 | * | 5/2011 | Osborne et al. ............... 438/478 |

FOREIGN PATENT DOCUMENTS

| | | |
|---|---|---|
| KR | 10-2002-0059172 | 7/2002 |
| KR | 10-0416629 | 5/2004 |
| KR | 10-2007-0080306 | 8/2007 |
| WO | WO 2007/012027 | 1/2007 |
| WO | WO 2009/120862 | 10/2009 |
| WO | WO 2009/128887 | 10/2009 |
| WO | WO 2010/002815 | 1/2010 |
| WO | WO 2010/040908 | 4/2010 |
| WO | WO 2010/083899 | 7/2010 |

OTHER PUBLICATIONS

Microtherm® Standard Block High Temperature Microporous insulation brochure, issue ref. 090207/01, 5 pp.

International Search Report and Written Opinion, issued Jul. 15, 2011, by the Korean Intellectual Property Office for International Application No. PCT/US2010/057058, 12 pp.

* cited by examiner

FLUID BED REACTOR

CROSS REFERENCE TO RELATED APPLICATION

This claims the benefit of U.S. Provisional Application No. 61/262,401, filed Nov. 18, 2009, which is incorporated herein by reference.

FIELD

The present disclosure relates to pyrolytic decomposition of a silicon-bearing gas in a fluidized bed to produce silicon-coated particles.

BACKGROUND

Pyrolytic decomposition of silicon-bearing gas in fluidized beds is an attractive process for producing polysilicon for the photovoltaic and semiconductor industries due to excellent mass and heat transfer, increased surface for deposition, and continuous production. Compared with a Siemens-type reactor, the fluidized bed reactor offers considerably higher production rates at a fraction of the energy consumption. The fluidized bed reactor can be continuous and highly automated to significantly decrease labor costs.

A common problem in fluidized bed reactors is fouling of the nozzle and surrounding reactor walls as silicon deposits form around the nozzle opening and on the walls. Silicon-bearing gas also may decompose and deposit silicon within the nozzle if the temperature is sufficiently high. Another common problem is contamination of the fluid bed at high operating temperatures by materials used to construct the reactor. For example, nickel has been shown to diffuse into a silicon layer from the base metal in high-nickel alloys.

SUMMARY

Fluidized bed reactor systems for production of high purity silicon-coated particles are disclosed. Disclosed embodiments of fluidized bed reactor systems reduce fouling of the nozzle opening and reactor walls compared to earlier designs. Disclosed embodiments of the fluidized bed reactor systems also include a removable liner and an optional removable sleeve constructed of materials that reduce contamination of particles in the fluid bed.

One system comprises a vessel defining a reaction chamber. The vessel has an outer wall, an insulation layer that is adjacent to an inner surface of the outer wall, a plurality of heaters positioned alongside and radially inwardly of the insulation layer and spaced concentrically around the insulation layer, and a removable, generally cylindrical liner positioned inwardly of the plurality of heaters, wherein the liner defines a chamber that contains a plurality of seed particles and/or silicon-coated particles. The system further includes a central inlet nozzle, a plurality of fluidization nozzles, at least one cooling gas nozzle positioned below the plurality of fluidization nozzles, and at least one outlet through a lower surface of the chamber wall for silicon product removal.

Advantageously, the liner is made of a high temperature alloy. In certain systems, the system also includes a removable, generally cylindrical sleeve positioned concentrically and adjacent to an inner surface of the removable liner. The sleeve may be made of non-contaminating materials including, but not limited to, quartz, silicon, low-nickel alloy, high-temperature alloy, cobalt alloy, silicon nitride, graphite, silicon carbide, molybdenum, or a molybdenum alloy. In some systems, the sleeve comprises a plurality of joined sections. The insulation layer also may comprise a plurality of joined sections.

In some systems, a liner expansion device is attached to an upper edge of the liner, wherein the liner expansion device compresses upon thermal expansion of the liner. The liner expansion device may be corrugated metal or a wave spring. In certain systems comprising a sleeve, a sleeve expansion device is attached to an upper edge of the sleeve, wherein the sleeve expansion device compresses upon thermal expansion of the sleeve. The sleeve expansion device may be a wave spring.

In certain systems, generally cylindrical array of radiant heaters are positioned between the insulation layer and the liner. In some systems, the radiant heaters are spaced roughly equidistant from one another to provide substantially uniform heating of the liner. In particular systems, the components of the reactor are composed and positioned such that, during operation, the outer wall has an external temperature less than 150° F. (65° C.).

In particular systems, the central inlet nozzle has an upper opening positioned to inject a primary gas upwardly into the reactor chamber. The nozzle has a tubular inner wall and a tubular outer wall positioned concentrically around the inner wall such that the primary gas flows through a center region defined by the inner wall and a secondary gas flows through an annular region defined by the inner wall and the outer wall. Advantageously, the annular region has a width at its upper opening that is smaller than the seed particles. In some systems, central inlet nozzle has a diameter at its upper opening of X, and the annular region has a width of 0.02X at its upper opening.

The primary gas typically comprises a silicon-bearing gas in combination with hydrogen and/or an inert gas, and the secondary gas has substantially the same composition as the hydrogen and/or inert gas. In certain systems, the primary gas comprises silane and hydrogen in a ratio from 1:1 to 9:1 by volume. In particular systems, the secondary gas flow facilitates formation of a primary gas vertical plume centrally in the reactor chamber such that silicon deposition on the upper opening of the central inlet nozzle and the chamber walls is substantially avoided.

In certain systems, the plurality of fluidization nozzles surround and are laterally displaced from the central inlet nozzle. In some systems, the fluidization gas has substantially the same composition as the hydrogen and/or inert gas. In particular systems, the central inlet nozzle is insulated to maintain the primary gas at a temperature lower than its decomposition temperature.

The foregoing will be better understood from the following detailed description, which proceeds with reference to the accompanying drawings.

DETAILED DESCRIPTION

Disclosed herein are fluidized bed reactor systems for the formation of polysilicon by pyrolytic decomposition of a silicon-bearing gas and deposition of silicon onto fluidized silicon particles or other seed particles (e.g., silica, graphite, or quartz particles). Also disclosed are methods for operating the fluidized bed reactor systems.

Silicon is deposited on particles in a reactor by decomposition of a silicon-bearing gas selected from the group consisting of silane ($SiH_4$), disilane ($Si_2H_6$), higher order silanes ($Si_nH_{2n+2}$), dichlorosilane ($SiH_2Cl_2$), trichlorosilane ($SiHCl_3$), silicon tetrachloride ($SiCl_4$), dibromosilane ($SiH_2Br_2$), tribromosilane ($SiHBr_3$), silicon tetrabromide ($SiBr_4$), diiodosilane ($SiH_2I_2$), triiodosilane ($SiHI_3$), silicon tetraiodide ($SiI_4$), and mixtures thereof. The silicon-bearing gas may be mixed with one or more halogen-containing gases, defined as any of the group consisting of chlorine ($Cl_2$), hydrogen chloride (HCl), bromine ($Br_2$), hydrogen bromide (HBr), iodine ($I_2$), hydrogen iodide (HI), and mixtures thereof. The silicon-bearing gas may also be mixed with one or more other gases, including hydrogen ($H_2$) or one or more inert gases selected from nitrogen ($N_2$), helium (He), argon (Ar), and neon (Ne). In particular embodiments, the silicon-bearing gas is silane, and the silane is mixed with hydrogen.

The silicon-bearing gas, along with any accompanying hydrogen, halogen-containing gases and/or inert gases, is introduced via a nozzle into a fluidized bed reactor and thermally decomposed within the reactor to produce silicon which deposits upon seed particles inside the reactor.

Fouling of the nozzle and surrounding reactor walls may occur as silicon deposits form around the nozzle opening and on the walls. Silicon-bearing gas also may decompose and deposit silicon within the nozzle if the temperature is sufficiently high.

As discussed in U.S. Pat. No. 5,810,934, which is incorporated herein by reference, it is helpful to heat the silicon seed and other silicon bed particles to a higher temperature than the reactor wall to reduce wall deposits. One method is to provide much of the heat at or close to the interface of a silane inlet nozzle with the hot silicon particles. The particles quickly heat up the incoming gas, but are cooled themselves. It is desirable to reheat the particles as close to the inlet nozzle as possible to keep the particle temperature high in the area surrounding the nozzle opening where the silicon-bearing gas concentration is the highest and most of the decomposition and deposition take place. However, care should be taken to avoid overheating the incoming silicon-bearing gas prior to its contact with the hot particles to minimize wall deposits within the inlet nozzle.

I. Fluidized Bed Reactor

Figure 1A:
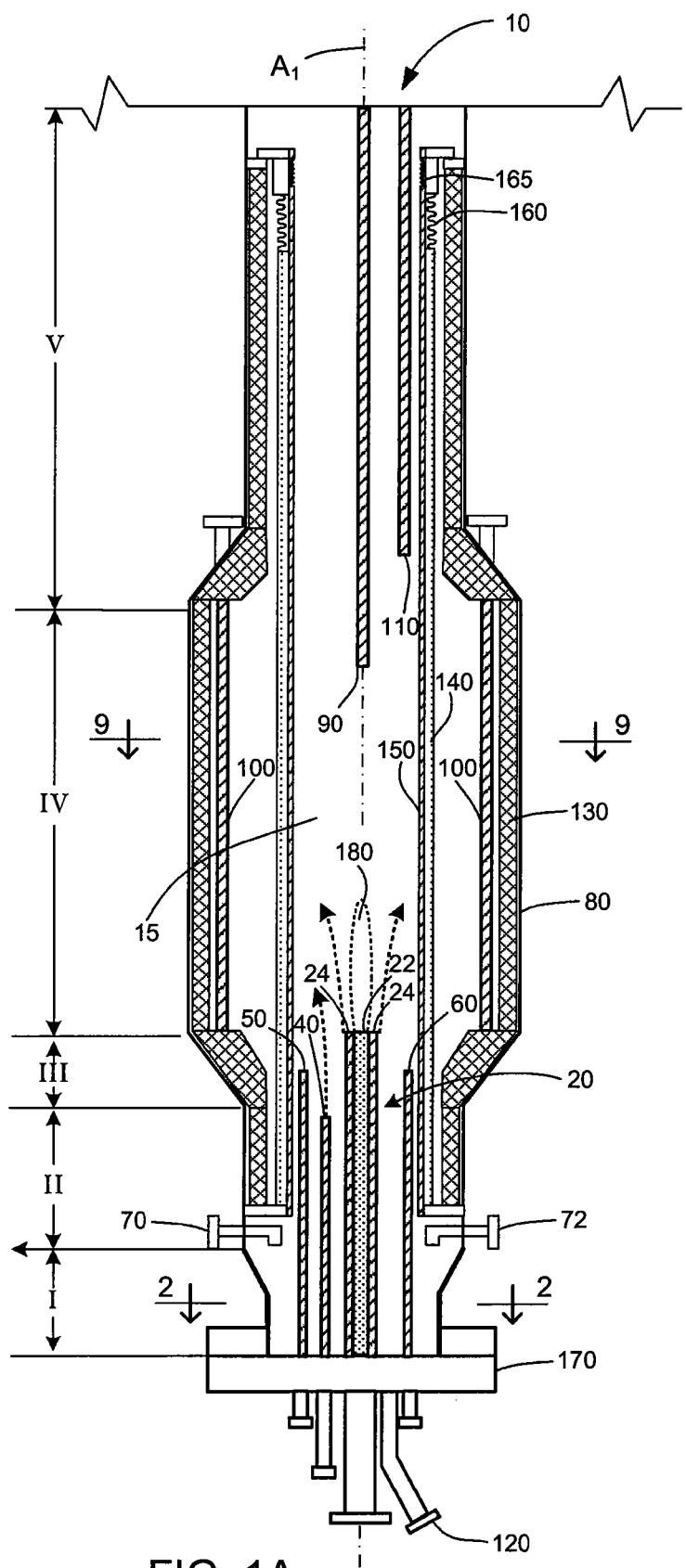
FIG. 1A is a schematic cross-sectional elevational view of a fluidized bed reactor.
Figure 1B:
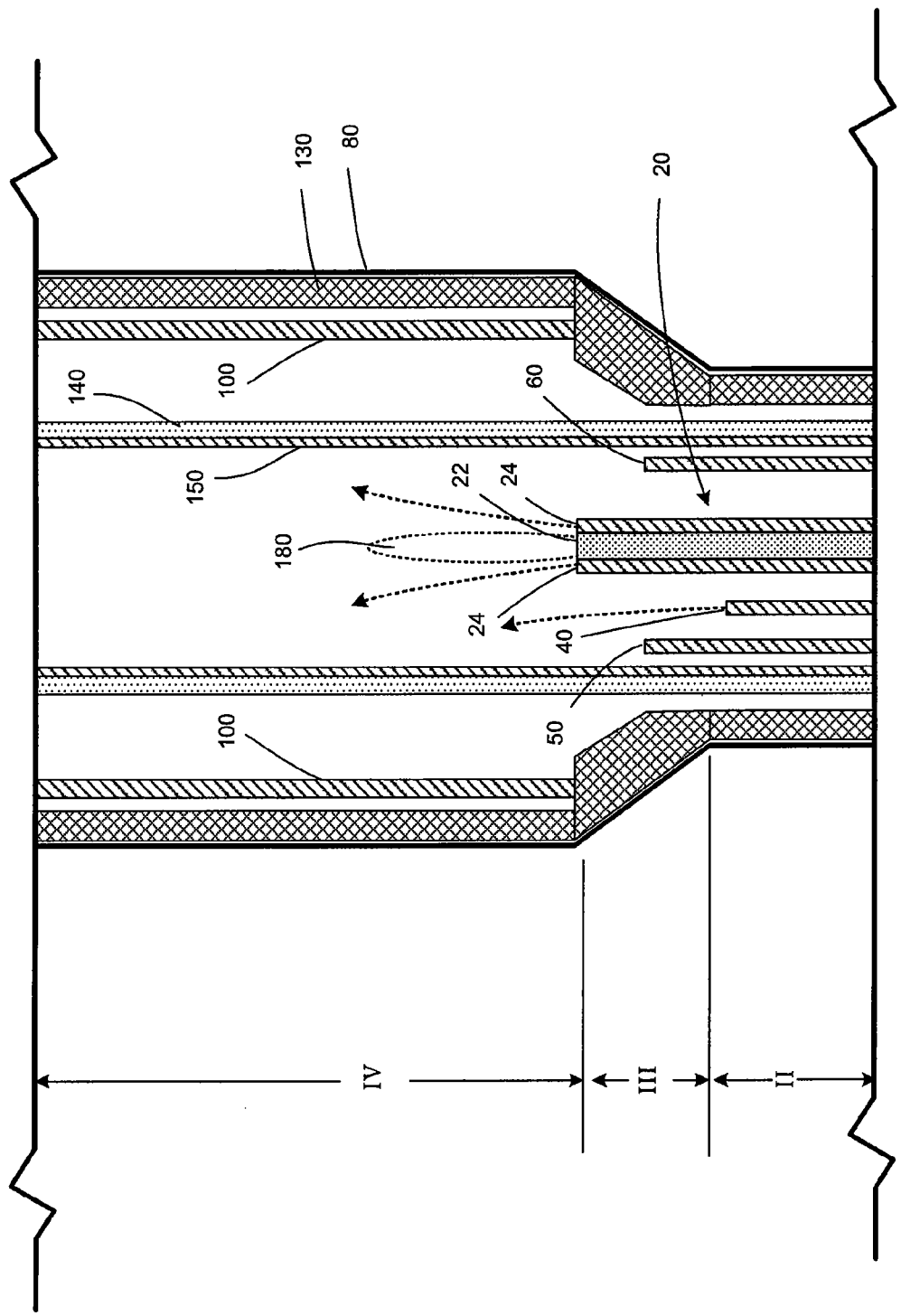
FIG. 1B is an enlarged view of a portion of FIG. 1A.

FIG. 1A is a schematic overview of a fluidized bed reactor 10 for production-coated particles. FIG. 1B is an enlarged view of a portion of FIG. 1A. Silicon-coated particles are grown by pyrolytic decomposition of a silicon-bearing gas within reactor chamber 15 and deposition of silicon onto particles within a fluidized bed. The illustrated reactor 10 is particularly well suited for silicon production by the pyrolytic decomposition of silane. Initially the deposition is onto small seed particles. Deposition continues until particles are grown to a size appropriate for commercial use, whereupon the grown particles are harvested.

Seed particles may have any desired composition that is suitable for coating with silicon. Suitable compositions are those that do not melt or vaporize, and do not decompose or undergo a chemical reaction under the conditions present in the reactor chamber. Examples of suitable seed particle compositions include, but are not limited to, silicon, silica, graphite, and quartz. Seed particles may have any desired morphology. For example, the seed particles may be spheres, elongated particles (e.g., rods, fibers), plates, prisms, or any other desired shape. Seed particles also may have an irregular morphology. Typically seed particles have a diameter in the largest dimension of 0.1-0.8 mm, such as 0.2-0.7 mm or 0.2-0.4 mm.

A solitary central inlet nozzle 20 is provided for injection of a primary gas through a central passageway 22 and a secondary gas through an annular passageway 24 surrounding central passageway 22. Some systems may include a plurality of inlet nozzles (not shown). The primary gas is silicon-bearing gas or a mixture of silicon-bearing gas, hydrogen and/or an inert gas (e.g., helium, argon). The primary gas also may include a halogen-containing gas. The secondary gas typically has substantially the same composition as the hydrogen and/or inert gas in the primary gas mixture. In particular arrangements, the primary gas is a mixture of silane and hydrogen, and the secondary gas is hydrogen.

In another system (not shown), a primary gas nozzle is provided for injection of the silane. Surrounding the primary gas nozzle is a plurality of secondary gas nozzles. Typically, six secondary gas nozzles are arranged in an array surrounding and spaced laterally from the primary gas nozzle. In some systems (not shown), the reactor includes a plurality of silane nozzles, e.g., three silane nozzles with each silane nozzle surrounded by six secondary gas nozzles. In such systems, the plurality of silane nozzles typically are arranged in an array surrounding and spaced laterally from a central location within the reactor; in certain systems, one of the silane nozzles may be positioned at the central location.

The reactor 10 extends generally vertically, has a central axis $A_1$, and may have cross-sectional dimensions that are different at different elevations. The reactor shown in FIG. 1 has five regions I-V of differing cross-sectional dimensions at various elevations. The reaction chamber may be defined by walls of different cross-sectional dimensions, which may cause the upward flow of gas through the reactor to be at different velocities at different elevations.

Reactor 10 further includes a plurality of fluidization gas nozzles 40. Additional hydrogen and/or inert gas can be delivered into the reactor through the fluidization nozzles 40 to provide sufficient gas flow to fluidize the particles within the reactor bed. In operation, the fluidized bed is maintained in regions III-IV. The flow rate through the fluidization nozzles 40 can be adjusted to maintain the profile of the bed as the mean particle diameter of the silicon-coated particles changes and/or the fluidization conditions change. The fluidization gas typically has substantially the same composition as the non-silicon-bearing gas in the primary gas mixture.

Also provided are a sample nozzle 50 through which product is sampled and one or more pressure nozzles 60 for monitoring pressure within the reactor, which nozzles are laterally displaced from the central inlet nozzle 20. One or more purge gas/cooling gas nozzles 70, 72 are located below the fluidization nozzles 40 and extend radially through outer wall 80 and into the reactor 10.

The reactor 10 further includes one or more heaters 100 positioned inwardly of outer wall 80 in region IV. In some systems, heaters 100 are radiant heaters. The reactor 10 also may include an internal bed heater 90.

At the outset of production and during normal operations, seed particles are introduced into reactor 10 through a seed nozzle 110. Silicon-coated particles of a size distribution with an average diameter of approximately 1 mm are harvested by removal from reactor 10 through one or more product outlets 120. Outlet(s) 120 are defined by surfaces coated with silicon carbide or another non-contaminating liner/coating material to prevent surface contamination of passing silicon-coated particles.

A layer of insulation 130 is positioned along the inner surface of outer wall 80. A removable, concentric liner 140 extends vertically through regions II-V of the reactor 10. The illustrated liner is generally cylindrical, having a generally circular cross-section. A removable sleeve 150 is positioned proximate the inner surface of the liner 140. An expansion joint system includes a liner expansion device 160 that extends upwardly from the upper surface of the liner 140. Liner expansion device 160 can compress to allow for thermal expansion of the liner 140 during operation of reactor 10. A second expansion joint system includes a sleeve expansion device 165 that extends upwardly from the upper surface of the sleeve 150. Sleeve expansion device 165 can compress to allow for thermal expansion of the sleeve 160 during operation of reactor 10.

The illustrated liner 140 and sleeve 150 are generally cylindrical, have a generally circular horizontal cross-section, extend generally vertically through regions II-V, and define a reaction zone. The reactor 10 is charged with seed particles through seed nozzle 110. The quantity of seed particles may vary based upon the dimensions of the reactor. For example, a reactor having a height of 6-9 meters and a reaction zone diameter of 40-50 cm may be charged with 800-1000 kg of silicon seed particles.

Advantageously, a silicon carbide coating or a coating of other material that does not add contamination to the final product can be provided on all surfaces that come into contact with silicon-coated particles to prevent surface contamination.

Insulation layer 130 thermally insulates outer wall 80 from radiant heaters 100. Insulation layer 130 additionally may reflect heat back to the liner 140 for improved heat transfer. In some systems, insulation layer 130 keeps the external temperature of outer wall 80 to less than 95° C. (200° F.), and advantageously to less than 65° C. (150° F.), thus producing a "cold wall" reactor.

Figure 2:
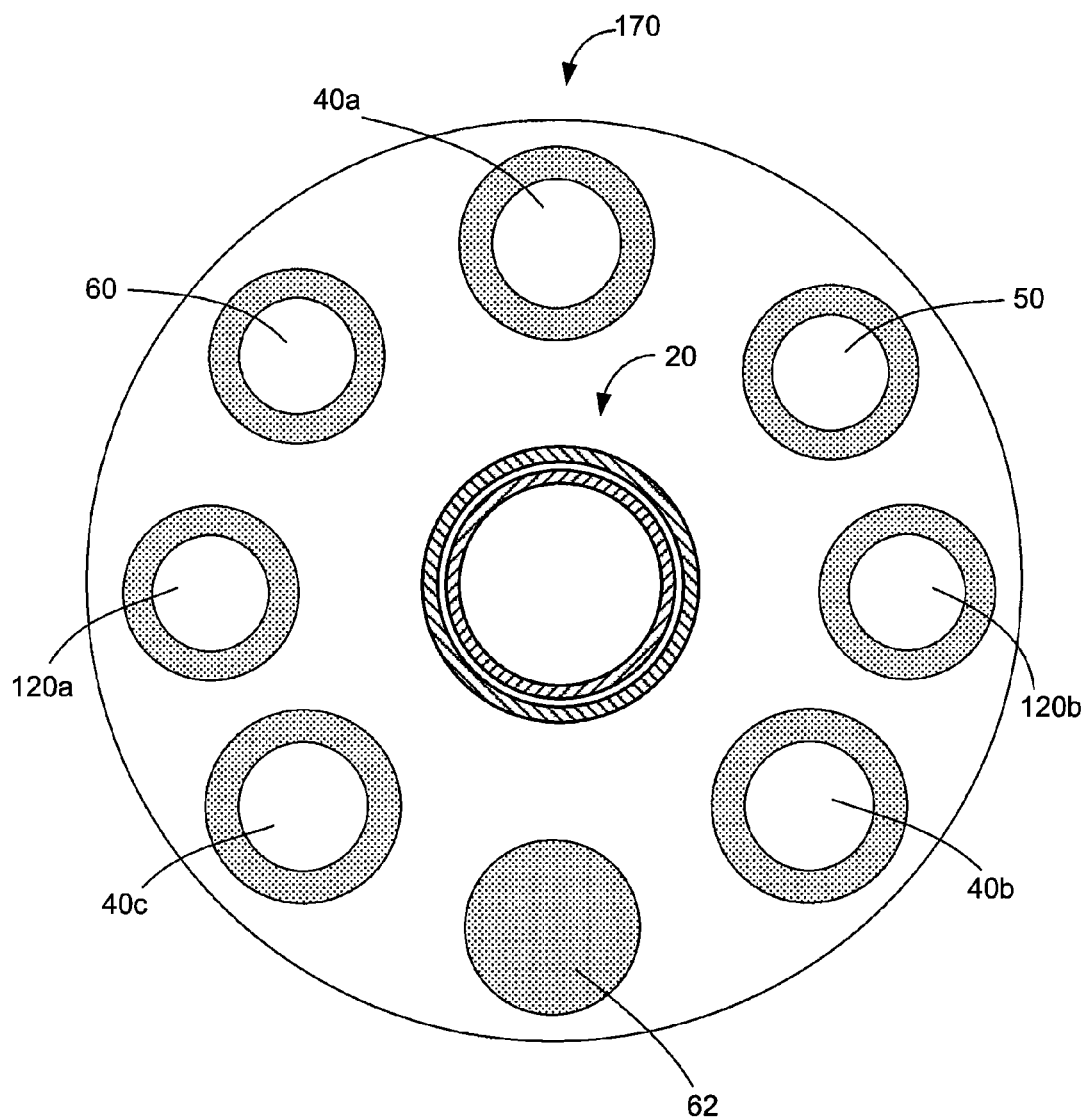
FIG. 2 is a schematic cross-sectional view taken along line 2-2 of FIG. 1, depicting the bottom head of the reactor.

FIG. 2 is a schematic cross-sectional view of one system of a bottom head 170. In the system shown, three fluidization nozzles 40a-c surround and are laterally displaced from the central inlet nozzle 20. Two product withdrawal outlets 120a-120b, a sample nozzle 50, a pressure nozzle 60, and a thermowell 62 also are laterally displaced from and surround the central inlet nozzle 20.

A person of ordinary skill in the art understands that other systems may include more than one primary gas nozzle, each primary gas nozzle surrounded by a plurality of secondary gas nozzles. For example, there may be three primary gas nozzles, each surrounded by six secondary gas nozzles. Additional fluidization nozzles also may be included. Furthermore, there may be only one withdrawal outlet, or there may be more than two withdrawal outlets.

II. Insulation

In particular systems, the reactor is insulated with high efficiency, high temperature insulation. Suitable insulation may include a high-temperature blanket, preformed block, jacketed insulation, refractory brick, or other suitable insulation.

Figure 3A:
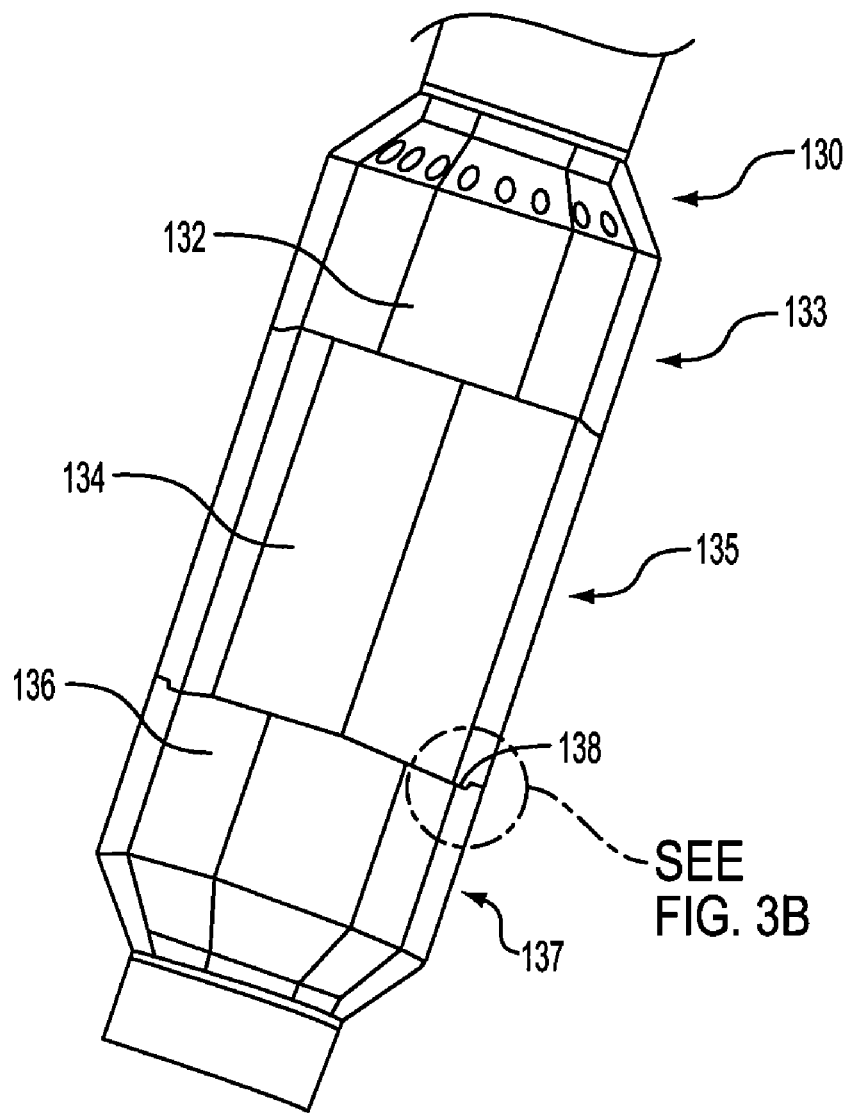
FIG. 3 is a schematic elevational view of the insulation layer of the reactor of FIG. 1.
Figure 3B:
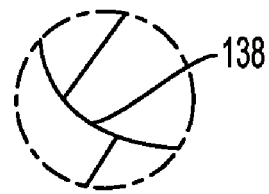
Figure 4:
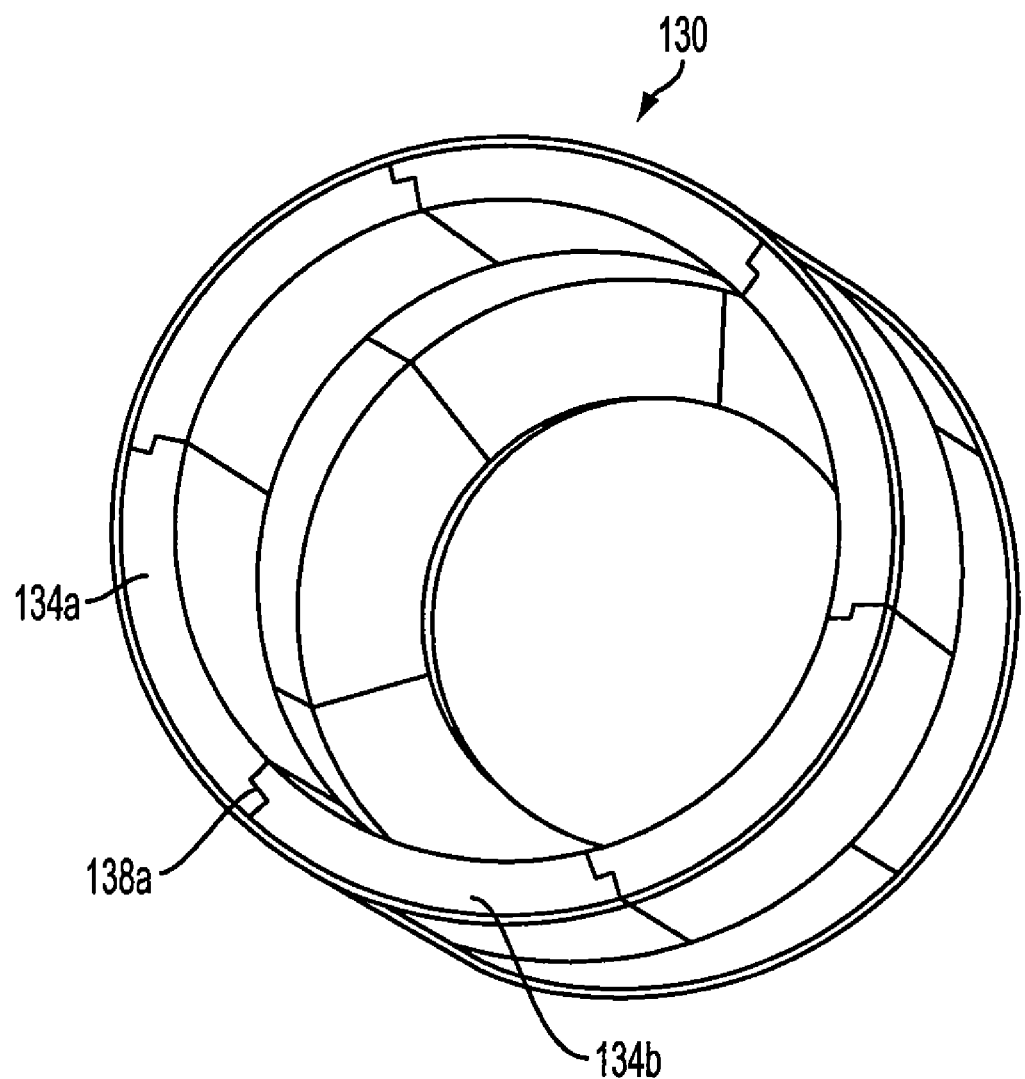
FIG. 4 is an enlarged schematic oblique view of a portion of the insulation layer of FIG. 3.

FIGS. 3 and 4 illustrate an advantageous construction of the insulation layer 130. As shown in FIG. 3, insulation layer 130 is constructed from three rings 133, 135, 137 of insulation. Each ring is constructed from six substantially identical pieces or sections 132, 134, 136 that fit together to form the ring. The illustrated pieces are 60° sections of the insulation tube. The sections typically range from 2 to 3 feet in vertical length. As shown in detail, the vertical edges of the sections are stepped so as to fit together in step joints 138 when assembled to form insulation layer 130. Ceramic fiber is placed between the sections to seal the joints. FIG. 4 is a perspective view of a portion of insulation layer 130, which illustrates a step joint 138a between sections 134a, 134b.

In some systems, the annular space between insulation 130 and liner 140 can be purged with nitrogen to ensure that reactive gases do not enter the annular space. When hydrogen is used in the reactor, purging with nitrogen also can improve the performance of the insulation by excluding the highly thermally-conductive hydrogen from the interstices of the insulation.

III. Liner and Sleeve

A. Liner

With reference to FIG. 1, a removable, concentric liner 140 extends vertically through sections II-V of reactor 10. The illustrated liner is generally cylindrical with a generally circular cross-section. The liner can be constructed from any suitable material that can tolerate the conditions within reactor 10 and is well-suited to the high temperatures utilized to transfer heat into the fluid bed. The liner is constructed from materials that will not contaminate the silicon product particles and are suitable for tolerating the temperature gradients associated with heating the fluid bed and cooling the product. Suitable materials include, but are not limited to, high-temperature metal alloys such as INCOLOY® alloys, INCONEL® alloys, and cobalt alloys (e.g., RENE® 41). The liner can be of different material than the reactor vessel. Because the pressures internal and external to the liner are similar, the liner can be thin. In some systems, the liner has a thickness of 5-10 mm, such as 6-8 mm.

If a removable sleeve 150 will be used, the liner 140 can be made with a wider variety of materials, including materials of lesser technical sensitivity, since contamination within the reactor will be less of a concern when a sleeve 150 is placed between liner 140 and reactor chamber 15. For example, the liner can be made of INCONEL® 625 (a nickel-chromium-molybdenum alloy with smaller amounts of niobium, tantalum, and iron). In one embodiment, an INCONEL® 625 liner has a thickness of 6 mm.

In the system shown in FIG. 1, the liner 140 has a substantially constant inner diameter throughout its length. In some systems (not shown), however, region V of reactor 10 may have a larger diameter than region IV. In such instances, the portion of liner in region V similarly may have a larger diameter than the portions of the liner extending through regions II-IV. The liner 140 provides containment of the fluidized bed and separates it from the radiant heaters 100, the insulation layer 130, and the outer wall 80 of the reactor.

B. Sleeve

In some systems, a removable sleeve 150 is provided adjacent to the inner surface of the liner 140. Sleeve 150 protects the liner 140 from attrition by silicon-coated particles and seed particles in the fluidized bed and protects the particles from contamination by the liner and/or vessel wall materials. Sleeve 150 is constructed from materials that will not contaminate the particles. Suitable materials for sleeve 150 include, but are not limited to, non-contaminating materials including, but not limited to, quartz, silicon, low-nickel alloy, high-temperature alloy, cobalt alloy, silicon nitride, graphite, silicon carbide, molybdenum, or a molybdenum alloy. In particular systems, the sleeve is constructed from silicon carbide, molybdenum, or a molybdenum alloy. In some systems, sleeve 150 includes a coating on its inner surface. Suitable materials for the coating include, but are not limited to, quartz, silicon, silicon carbide, molybdenum, low-nickel alloys, cobalt, tungsten, silicon nitride, and graphite.

In some arrangements, sleeve 150 typically is constructed in sections, similar to insulation layer 130; the sections are joined with step joints, and the joints are sealed with ceramic fiber, cement, or high-temperature polymer sealant. In other arrangements, the sleeve can be constructed as a monolith. The sleeve preferably can sustain a temperature of 1600° F. (870° C.) and maintain stability.

Molybdenum has exceptional properties, including high corrosion resistance, low thermal expansion, excellent strength and stiffness at high temperature, excellent thermal conductivity, and ductility. Typical properties of pure molybdenum are shown in Table 1 below:

TABLE 1

| Molybdenum Properties | |
| --- | --- |
| Density (20° C.) | 10.28 g/cm$^3$ |
| Melting Point | 2620° C. |
| Specific Heat (20° C.) | 0.254 J/g · K |
| Thermal Conductivity | 140 W/m · K |
| Recrystallization Temperature | 1100° C. |
| Coefficient of Thermal Expansion | $4.9 \times 10^{-6}$/° C. |
| Modulus of Elasticity | $46 \times 10^6$ psi |

Molybdenum, however, experiences severe oxidation at temperatures above 750° F. (400° C.). Thus, exposure to oxygen at high temperatures is minimized. In particular systems, the sleeve is constructed of TZM molybdenum alloy, with a composition of 99.2-99.5 wt % molybdenum, 0.5% titanium, and 0.08% zirconium.

Another suitable material is silicon carbide (SiC). Silicon carbide also has a low thermal expansion coefficient of 2.2-2.4×10$^{-6}$/° F., or 3.9-4.0×10$^{-6}$/° C. Thus, a silicon carbide sleeve may expand vertically 6 mm to 13 mm as the reactor is heated. Silicon carbide, however, is less robust than molybdenum and its alloys, and may be more prone to breakage.

Sleeve 150 may be constructed in sections, similar to insulation layer 130. The sections are joined with step joints. Joining can be performed by any suitable method, including riveting and welding. For example, the sections may be riveted with molybdenum rivets spaced approximately 2 cm apart. In some systems, the seams subsequently are sprayed with molybdenum for improved leak resistance. Riveting is preferred over welding because welding typically produces weaker joints.

If welding is utilized, it is performed in a vacuum environment or argon atmosphere to prevent oxidation and maintain the desired molybdenum properties. To maintain ductility at the weld, no contact with air should occur. Before welding, all parts are meticulously cleaned and preheated.

In some systems, the sleeve 150 is fabricated from multiple layers of molybdenum or TZM molybdenum alloy plates (e.g., 0.6-mm to 3-mm thick plates) laminated together. For example, 2-5 layers may be laminated together. In a particular arrangement, four layers are laminated to produce a sleeve having a thickness of 3.2-6.4 mm. When constructed in layers, the layers are offset such that any joints between the plates in adjacent layers do not overlap.

IV. Outer Wall to Sleeve Configuration

Figure 5:
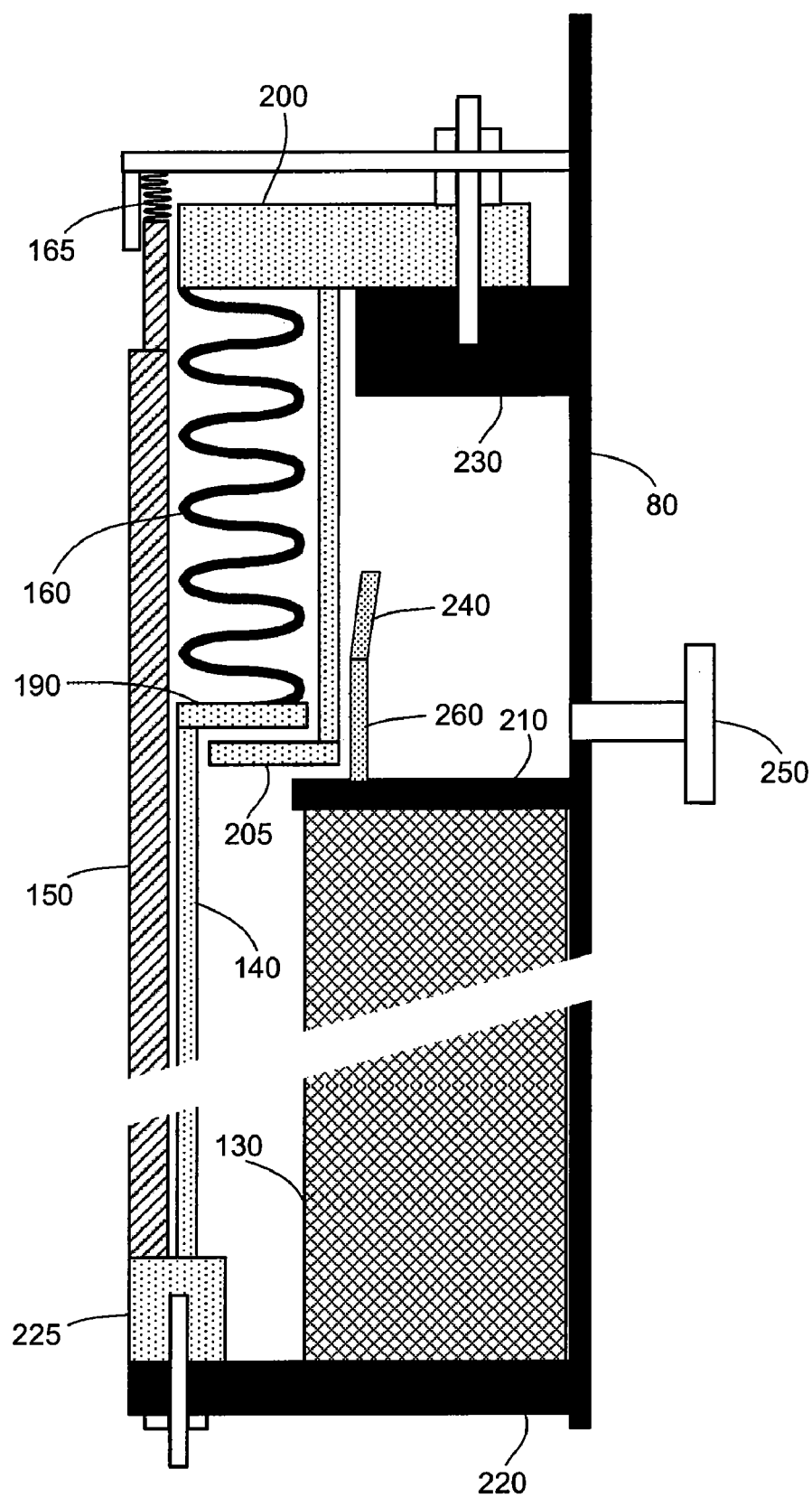
FIG. 5 is an enlarged schematic cross-sectional elevational view of a portion of the reactor of FIG. 1, depicting an outer wall, an insulation layer, a liner with a liner expansion device, and a sleeve.

FIG. 5 is a schematic diagram illustrating one system of a reactor configuration from outer wall 80 to sleeve 150. Insulation layer 130 is disposed adjacent to outer wall 80 and maintained in position between an insulation support ring 210 and a lower seal ring 220. The liner 140 is positioned inwardly of insulation layer 130 and is supported by the lower seal ring 220. A flange 225 is provided between the liner 140 and the seal ring 220. In some systems, flange 225 is a gasketed seal. The sleeve 150 is positioned inwardly of the liner 140. There is a narrow annular gap, e.g., 1.5 mm, between the liner 140 and sleeve 150 to allow for horizontal thermal expansion. The radiant heaters (not shown) are disposed between insulation layer 130 and the liner 140 in region IV of reactor 10 as illustrated in FIG. 1.

An upper guide 190 is attached to the top edge of the liner 140. An expansion joint system includes a liner expansion device 160 that extends between upper guide 190 and an expansion support 200, which is attached securely to an upper seal ring 230. The expansion joint system accommodates the differential expansion of the liner 140 and the outer wall 80 of the reactor. Extending downward from expansion support 200 is an L-shaped lower guide 205. Installation guide 240 facilitates proper positioning of expansion support 200 and L-shaped lower guide 205. Liner expansion device 160 is a spring-type device having an inner diameter similar to the inner diameter of the liner 140. Liner expansion device 160 exerts a downward pressure on liner 140, compressing flange 225. Liner expansion device 160 is constructed of material suitable for withstanding the temperature and pressure conditions within the fluidized bed reactor. For example, high-temperature, high-strength metal alloys, including INCONEL® 718 (a nickel-chromium alloy), may be suitable. In some systems, liner expansion device 160 is an expansion joint of corrugated metal alloy. In certain systems, the liner is silicon carbide and liner expansion device 160 is a wave spring, i.e., a coiled flat wire with waves in the wire. As compared to coil springs, wave springs provide the same force with a significantly lower work height.

As the temperature rises within the reactor, the liner 140 expands and liner expansion device 160 is pushed upward and compressed. For example, if reactor has a height of 6-9 meters and the liner 140 comprises an INCOLOY® alloy, the liner may expand 7.5-10 cm vertically when heated. Upon cooling, the liner 140 contracts and liner expansion device 160 extends. Lower guide 205, in cooperation with upper guide 190, limits the extension of liner expansion device 160. Liner expansion device 160 also exerts pressure on the liner 140 and keeps it firmly sealed to lower seal ring 220.

A similar expansion joint system includes a sleeve expansion device 165 that extends upwardly from sleeve 150 to accommodate the differential expansion of sleeve 150 and outer wall 80 and allow for vertical expansion of the sleeve. Sleeve expansion device 165 exerts downward pressure on sleeve 150. Sleeve expansion device 165 is constructed of material suitable for withstanding the temperature and pressure conditions within the fluidized bed reactor. For example, high-temperature, high-strength metal alloys may be suitable. In some systems, sleeve expansion device 165 is a wave spring. Sleeve 150 may be supported and sealed by any suitable means such that gas does not flow from the fluid bed into the annulus between sleeve 150 and liner 140. In some systems (not shown), a device extends upwardly from the upper surface of the sleeve and securely attaches near the top edge of the liner. In such systems, the sleeve may be supported at its lower edge with a flanged and gasketed connection to outer wall 80.

A purge gas nozzle 250 extends through outer wall 80 above insulation support ring 210. A gas baffle 260 is positioned between nozzle 250 and lower guide 205. The annular space between outer wall 80 and liner 140 typically is filled with an inert gas, e.g., nitrogen.

V. Central Inlet Nozzle

The location of silane injection into the reactor 10 provides control of the reaction zone in which silane decomposition occurs. Advantageously, nozzle 20 is positioned such that silane is injected near the vertical centerline $A_1$ of the reactor 10 and at a distance from sleeve 150 sufficient to control silane plume 180 geometry. Advantageously, the upper opening of nozzle 20 is geometrically aligned with the center of the reactor for silane plume and bed mixing control. In particular systems, nozzle 20 is positioned such that the vertical centerline of the reactor extends through the throat of the nozzle. Advantageously, silane is injected at an elevation about 1 meter above the bottom head 170, as shown in FIG. 1. Nozzle 20 extends upward through regions I-III such that silane is injected into region IV. Nozzle 20 is positioned such that hydrogen injected below and around the silane injection point contains the vertical silane plume 180 in a region near the core and substantially eliminates fouling (i.e., silicon deposit formation) on the nozzle. The height of silane plume 180 depends upon multiple factors, including the rate of flow of the silane gas, and may be about one-fourth the height of region IV. For example, if region IV has a height of 240 cm, the silane plume may have a height of 60 cm.

In operation, a bed of seed particles is provided inside the reactor and is fluidized by gas injected through the solitary central inlet nozzle 20 and the supplemental fluidization nozzles 40. The contents of the reactor chamber are heated by the optional internal bed heater 90 and the radiant heaters 100.

The temperature within reactor 10 differs in various portions of the reactor. For example, when operating with silane as the silicon-containing compound from which silicon is to be released, the temperature in region I, i.e., the bottom zone, is 50-100° C. In region II, i.e., the cooling zone, the temperature typically ranges from 50-700° C. In region III, the intermediate zone, the temperature is substantially the same as in region IV. The central portion of region IV, i.e., the reaction and splash zone, is maintained at 620-760° C., and advantageously at 660-670° C., with the temperature increasing to 700-900° C. near the walls of region IV, i.e., the radiant zone. The upper portion of region V, i.e., the quench zone, has a temperature of 400-450° C.

The lower parts of the reactor are maintained at a cooler temperature to minimize or prevent premature decomposition of the silicon-bearing gas within the central inlet nozzle 20. Premature decomposition results in fouling and plugging of nozzle 20. Accordingly, the silicon-bearing gas temperature within the nozzle is maintained below that of decomposition and silicon deposition. For example, when the silicon-bearing gas is silane, the temperature within the nozzle is maintained below 150° C. The higher temperatures within region IV enable pyrolytic decomposition of the silicon-bearing gas and subsequent silicon deposition on the seed particles.

Figure 6:
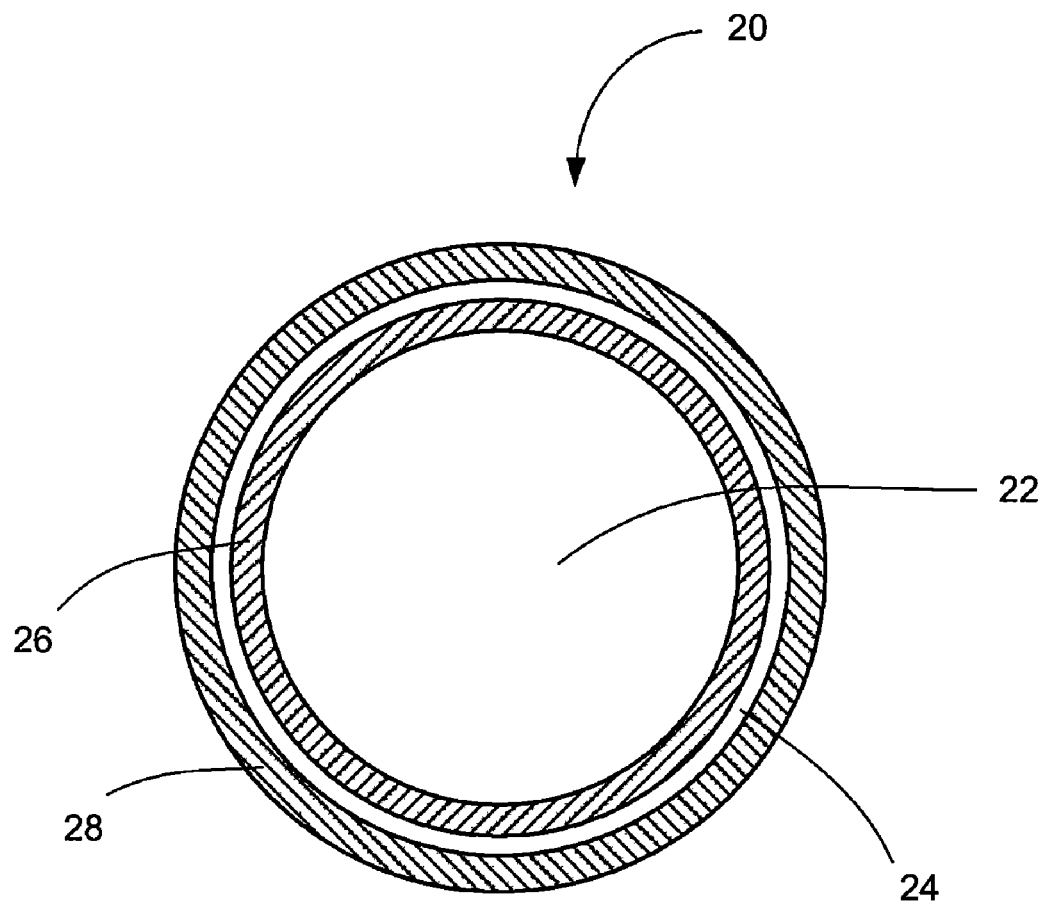
FIG. 6 is an enlarged schematic cross-sectional view taken along line 6-6 of FIG. 7A, depicting a gas nozzle of the reactor of FIG. 1.
Figure 7A:
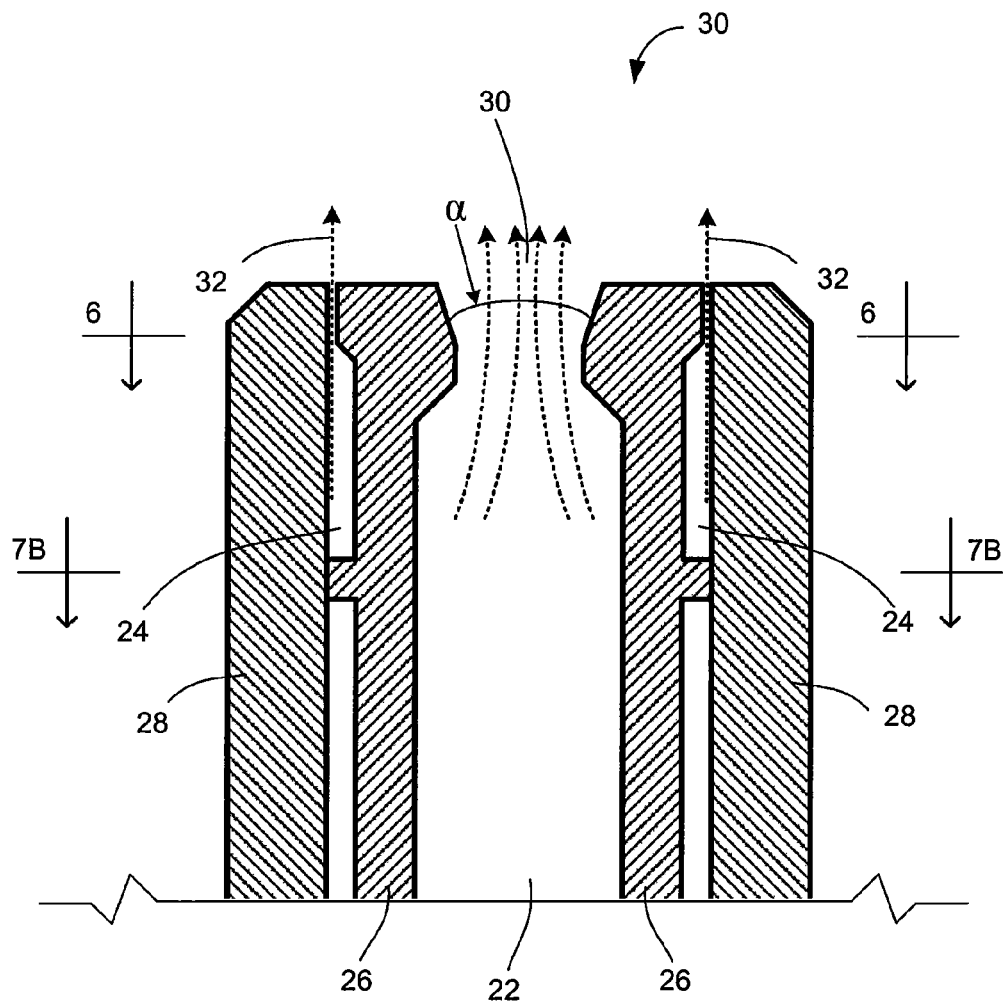
FIG. 7A is a schematic cross-sectional elevational view of an upper portion of the nozzle of FIG. 6.

In particular arrangements, central inlet nozzle 20 comprises two substantially cylindrical tubes that are substantially circular in cross-section, as shown in FIGS. 6 and 7. A flow of primary gas 30 passes through the center region or passageway 22 of nozzle 20. The primary gas typically includes a silicon-bearing gas diluted with hydrogen or an inert gas. In some arrangements, the primary gas is silane diluted with hydrogen. The silane and hydrogen typically are present in a silane:hydrogen ratio ranging from 1:1 to 9:1 by volume. A secondary gas 32 is introduced concentrically around the outlet of the passageway region 22 in an annular region or passageway 24 defined by inner wall 26 and outer wall 28. The secondary gas typically is the same composition as the gas mixed with the silicon-bearing gas. For example, if the primary gas includes silane and hydrogen, the secondary gas typically is hydrogen.

Figure 7B:
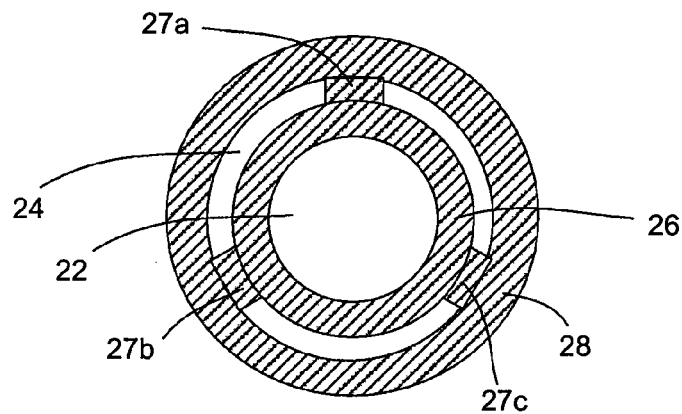
FIG. 7B is a schematic cross-sectional view taken along line 7B-7B of FIG. 7A.

In a desirable arrangement, the uppermost portion of the inner surface of inner wall 26 is angled outwardly at 15° such that the throat flares toward the opening at an included or combined angle α of 30° and has a diameter of 1.3 cm at the opening. FIG. 7B illustrates flanges 27a-c which space the inner wall 26 from the outer wall 28.

The annular passageway 24 is very narrow where it opens into the reaction chamber. Best results are achieved with an annular passageway outlet gap width that is smaller than the smallest particles in the bed, to prevent fouling. In some arrangements, when center passageway 22 has a diameter X, the radial width of annular passageway 24 is 0.015X to 0.025X, such as 0.02X. For example, if center passageway 22 has a diameter of 1.3 cm at the top edge, the radial width of annular passageway 24 may be 0.026 cm at the top edge. Gas flow 32 through annular passageway 24 substantially eliminates silicon deposition around the tip of nozzle 20.

The nozzle 20 is constructed using any material that is acceptable within the expected pressure, temperature and stress requirements. Suitable materials include high-temperature metal alloys such as, but not limited to, INCOLOY® and HASTALLOY™ alloys. The surfaces of inner wall 26 and 28 may be coated with silicon carbide for product quality.

Figure 8:
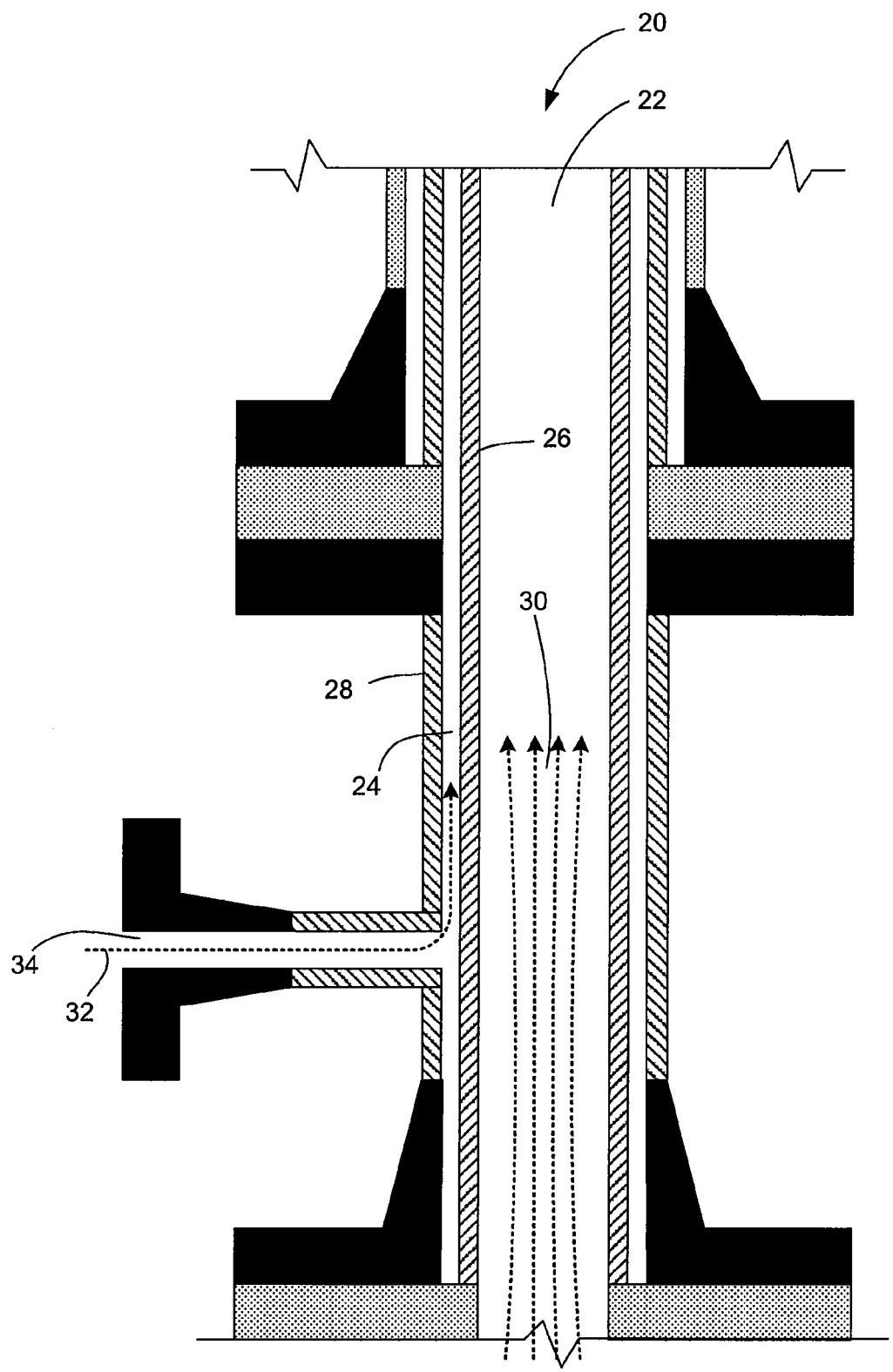
FIG. 8 is a schematic elevational cross-sectional view of a lower portion of the nozzle of FIG. 6.

FIG. 8 shows a lower portion of the nozzle 20. Primary gas 30 flows into the center passageway 22 through a bottom inlet (not shown). Secondary gas 32 flows into the annular passageway 24 via an inlet 34 in outer wall 28.

VI. Heaters

Figure 9:
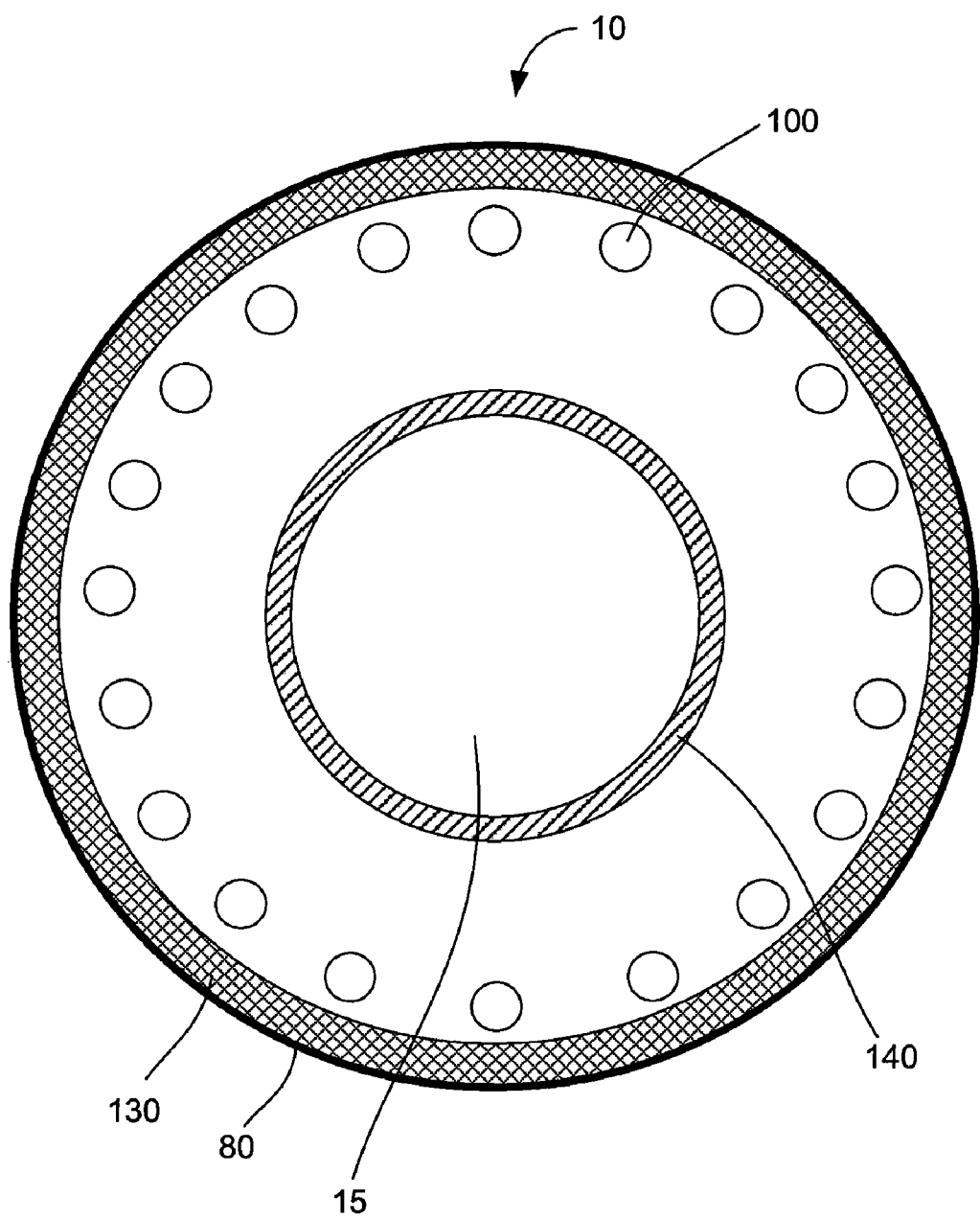
FIG. 9 is a schematic cross-sectional view taken along line 9-9 of FIG. 1, depicting a plurality of radiant heaters.

FIG. 9 shows a circular array of heaters 100 located concentrically around the chamber 15 between the liner 140 and insulation 130. In some systems, twenty radiant heaters 100 are utilized with the heaters 100 spaced equidistant from one another. The rating of the heaters is selected based at least in part on reactor size. In some systems, the heaters are rated at 2500 W each. With respect to the system illustrated in FIGS. 1 and 9, the heaters 100 are spaced inwardly of the insulation 130. For example, in a reactor with a height of 6-9 meters, the heaters 100 may be 2-3 meters long and may be spaced 2-3 cm inwardly of the insulation. The gap between the insulation 130 and the liner 140 contains a nitrogen atmosphere to keep the annular space inert.

A temperature gradient is present in the reactor 10 with the highest temperatures near the heaters; the temperature is reduced with increasing distance from the heaters. For instance, during operation of the reactor 10 with silane as the silicon-bearing gas, the central portion of region IV is maintained at 620-760° C., and advantageously at 660-670° C. Temperature near the sleeve 150, which is closer to the heaters 100, is at 700-900° C. In some systems, the surface temperature of radiant heaters 100 is 800-850° C. Heaters 100 are under temperature control and, in some systems, the temperature controller set point is manually adjusted to the desired temperature.

Reactor 10 further may include one or more convective heaters 90. These heaters extend into the fluidized bed in region IV as shown in FIG. 1.

VII. Fluidization

Referring to FIG. 1, a plurality of elevated fluidization nozzles 40 is arranged in a circular array that is located concentrically around central inlet nozzle 20. Cooling gas at ambient temperature is introduced into chamber 15 through cooling gas nozzles 70, 72. Cooling gas nozzles 70, 72 are positioned in region II above bottom head 170 and below the sleeve 150 and liner 140 arrangement. The cooling gas and fluidization gas typically have substantially the same composition as the hydrogen and/or inert gas that is mixed with the silicon-bearing gas in nozzle 20. Introduction of the cooling gas below the fluidization nozzles 40 provides a countercurrent flow of the cooling gas and product solids, resulting in cooling of the product solids prior to withdrawal through outlet 120 and preheating of the cooling gas before it flows into region IV of reactor 10. The reactor diameter, cooling gas flow rate, and/or cooling region height are selected to prevent fluidization in the cooling zone, which would provide mixing and heat the cooling zone to an unacceptable temperature. For example, the cooling gas may have a flow rate of 230-310 slm (standard liters per minute) when the cooling zone (region II) has an inner diameter of 45 cm. The countercurrent flow of the cooling gas carries fine particles back up to the fluidized zone for further reaction and silicon deposition.

Additional patent documents describing subject matter or background information which may be pertinent to the present disclosure include U.S. Pat. No. 5,139,762, issued Aug. 18, 1992, U.S. Pat. No. 5,798,137, issued Aug. 25, 1998, U.S. Pat. No. 5,810,934, issued Sep. 22, 1998, and U.S. patent application Ser. No. 11/996,285, filed Jan. 18, 2008.

It should be recognized that the illustrated systems are only examples and should not be taken as limiting the scope of the invention. Rather, the scope of the invention is defined by the following claims. We therefore claim as our invention all that comes within the scope and spirit of these claims.

We claim:

1. A heated silicon deposition reactor system, comprising:
   a plurality of seed particles;
   a vessel having an outer wall;
   an insulation layer facing an inner surface of the outer wall;
   at least one heater positioned inwardly of the insulation layer;
   a removable concentric liner positioned inwardly of the at least one heater, the liner having an inner surface which defines a chamber that contains the seed particles;
   a central inlet nozzle having an upper opening positioned to inject a primary gas comprising a silicon-bearing gas upwardly into the chamber, wherein the central inlet nozzle comprises an inner wall and an outer wall positioned concentrically around the inner wall to channel a flow of the primary gas through a center passageway defined by the inner wall and a flow of a secondary gas through an annular passageway between the inner wall and the outer wall;
   a plurality of fluidization nozzles, wherein each fluidization nozzle has an outlet opening into the chamber;
   at least one cooling gas nozzle opening into the chamber below the plurality of fluidization nozzles; and
   at least one outlet for removing silicon-coated product particles from the vessel.

2. The system of claim 1 further comprising:
   a source of the primary gas, wherein the source of the primary gas is connected to the center passageway of the central inlet nozzle; and
   a source of the secondary gas, wherein the source of the secondary gas is connected to the annular passageway of the central inlet nozzle.

3. The system of claim 1 where the removable concentric liner comprises a high temperature metal alloy.

4. The system of claim 1 further comprising a removable concentric sleeve positioned adjacent to the inner surface of the removable concentric liner.

5. The system of claim 4 where the removable concentric sleeve comprises quartz, silicon, low-nickel alloy, nickel alloy, cobalt alloy, silicon nitride, graphite, silicon carbide, molybdenum, or a molybdenum alloy.

6. The system of claim 4 where the removable concentric sleeve has a coating on its inner surface, wherein the coating comprises quartz, silicon, low-nickel alloy, nickel alloy, cobalt alloy, silicon nitride, graphite, silicon carbide, molybdenum, or a molybdenum alloy.

7. The system of claim 4 where the removable concentric sleeve comprises a plurality of joined sections.

8. The system of claim 7 where joints between the joined sections are step joints sealed with a sealant capable of withstanding an operating temperature up to 800° C.

9. The system of claim 8 where the sealant is ceramic fiber, cement, a high-temperature polymer sealant, or a combination thereof.

10. The system of claim 4 where the removable concentric sleeve further comprises a sleeve expansion device attached to an upper edge of the removable concentric sleeve, wherein the sleeve expansion device compresses upon thermal expansion of the sleeve.

11. The system of claim 10 where the sleeve expansion device is a wave spring.

12. The system of claim 1 where the removable concentric liner further comprises a liner expansion device attached to an upper edge of the removable concentric liner, wherein the liner expansion device compresses upon thermal expansion of the liner.

13. The system of claim 12 where the liner expansion device is corrugated metal or a wave spring.

14. The system of claim 1 where the annular passageway has a width at its upper opening that is smaller than the seed particles.

15. The system of claim 14 where the center passageway of the central inlet nozzle has a diameter at its upper opening of X, and the annular passageway has a width of 0.015X to 0.025X at its upper opening.

16. The system of claim 1 where the plurality of fluidization nozzles surround and are laterally displaced from the central inlet nozzle, and where each fluidization nozzle has an opening positioned to inject a fluidization gas upwardly into the chamber.

17. The system of claim 1 where the primary gas comprises silane and hydrogen, and the silane and hydrogen are present in a ratio from 1:1 to 9:1 by volume.

18. The system of claim 1 where the primary gas within the central inlet nozzle has a temperature at which the silicon-bearing gas does not decompose.

19. The system of claim 1 where the flow of secondary gas is positioned and of sufficient velocity to direct the flow of primary gas into a vertical plume centrally located in the chamber such that silicon deposit formation on the upper opening of the central inlet nozzle and the chamber walls is controlled.

20. The system of claim 1 where the insulation layer comprises a plurality of joined sections.

21. The system of claim 20 where joints between the joined sections of the insulation layer are step joints sealed with ceramic fiber.

22. The system of claim 1 where the at least one cooling gas nozzle is positioned to provide a cooling gas flow that is countercurrent to a flow of the silicon-coated product particles.

23. The system of claim 22 where the at least one cooling gas nozzle is positioned such that the cooling gas flow cools the silicon-coated product particles prior to withdrawal from the reactor system.

24. The system of claim 1 where the central inlet nozzle and fluidization nozzles are insulated to inhibit the transfer of heat from the chamber so as to maintain the primary gas within central inlet nozzle at a temperature lower than the decomposition temperature of the primary gas.

25. The system of claim 1 where the at least one heater comprises a plurality of heaters positioned inwardly of the insulation layer in a concentric array.

26. The system of claim 25 where the plurality of heaters comprises a plurality of radiant heaters located in a ring and spaced equidistant from one another.

27. The system of claim 1 where the seed particles comprise silicon particles, silica particles, graphite particles, quartz particles, or a combination thereof.

28. The system of claim 27 where the seed particles are silicon particles.

* * * * *